United States Patent
Maeda

(10) Patent No.: US 6,285,072 B1
(45) Date of Patent: Sep. 4, 2001

(54) SEMICONDUCTOR DEVICE CONTAINING A POROUS STRUCTURE AND METHOD OF MANUFACTURING THE SAME

(75) Inventor: Shigenobu Maeda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/396,358

(22) Filed: Sep. 15, 1999

(30) Foreign Application Priority Data

Apr. 26, 1999 (JP) .................................................. 11-117770

(51) Int. Cl.$^7$ .................................................. H01L 29/06
(52) U.S. Cl. ............................................ 257/618; 257/370
(58) Field of Search ..................... 257/618, 370; 438/459, 977, 456, 422

(56) References Cited

U.S. PATENT DOCUMENTS

| | | | |
|---|---|---|---|
| 5,679,475 | * 10/1997 | Yamagata | 257/347 |
| 5,970,339 | * 10/1999 | Choi | 257/618 |
| 5,998,822 | * 12/1999 | Wada | 257/618 |
| 6,037,634 | * 3/2000 | Akiyama | 257/347 |
| 6,130,151 | * 10/2000 | Lin | 438/619 |
| 6,180,497 | * 1/2001 | Sato | 438/458 |

OTHER PUBLICATIONS

Shigenobu Maeda, et al. "Analysis of Delay Time Instability According to the Operating Frequency in Field Shield Isolated SOI Circuits", IEEE Transactions on Electron Devices, vol. 45, No. 7, Jul. 1998, pp. 1479–1486.

Seijiro Furukawa "SOI Structure Forming Technique", Sangyotosho, 1987, pp. 181–185 (with English Abstract).

Tadahiro Ohmi, et al. "Science of Silicon", Realize Inc., pp. 467–475 (with English Abstract).

Kiyofumi Sakaguchi, et al. "Current Progress in Epitaxial Layer Transfer (ELTRAN)", IEICE Trans. Electron., vol. E80-C, No. 3, Mar. 1997, pp. 378–387.

Nobuhiko Sato, et al. "Defect Engineering in Epitaxial Layers over Porous Silicon for ELTRAN SOI Wafers", Extended Abstracts of the 1998 International Conference on Solid State Devices and Materials, 1998, pp. 302–303.

* cited by examiner

*Primary Examiner*—Olik Chaudhuri
*Assistant Examiner*—Nathan W. Ha
(74) *Attorney, Agent, or Firm*—Oblon, Spivak, McClelland, Maier & Neustadt, P.C.

(57) ABSTRACT

A semiconductor device and a method of manufacturing the same are provided with a silicon region of a first conductivity type, a silicon layer including at least one cavity existing inside the silicon region as a buried layer, and a source/drain region of a second conductivity type different from the first conductivity type selectively formed directly on an upper surface of the silicon region with a bottom surface of the source/drain region located adjacent to an upper surface of the silicon layer such that a depletion layer between the silicon region and the bottom surface of the source/drain region exists inside the silicon layer. With such a structure, a semiconductor device achieves a faster operation and lower power consumption while ensuring stable operation as a MOSFET.

18 Claims, 18 Drawing Sheets

SEMICONDUCTOR DEVICE CONTAINING A POROUS STRUCTURE AND METHOD OF MANUFACTURING THE SAME

BACKGROUND OF THE INVENTION

1. Field of the Invention

The present invention relates to a semiconductor device and a method of manufacturing the same, and more particularly to a MOSFET structure and a method of manufacturing the same.

2. Description of the Background Art

FIG. 21 is a cross section showing a background-art MOSFET structure using a bulk substrate. A multi-layered structure consisting of a gate oxide film 102 and a gate electrode 103 layered in this order is selectively formed on an upper surface of a silicon substrate 101. Sidewalls 104 are formed on side surfaces of the gate oxide film 102 and the gate electrode 103. A source region 105 and a drain region 106 are selectively formed in the upper surface of the silicon substrate 101.

Applying a voltage to the silicon substrate 101 from its backside makes a potential of the silicon substrate 101 fixed and ensures a stable operation of a transistor and a circuit against variation in potential of the gate electrode 103 and the source and drain regions 105 and 106.

FIG. 22 is a cross section showing a background MOSFET using an SOI (Silicon On Insulator) substrate. The SOI substrate has a silicon substrate 110, a buried oxide film 111 and a silicon layer 112. Further, like the structure of FIG. 21, the gate oxide film 102, the gate electrode 103 and the sidewalls 104 are selectively formed on the upper surface of the silicon layer 112. The source region 105 and the drain region 106 are selectively formed in the upper surface of the silicon layer 112. A body region 113 is formed between the source region 105 and the drain region 106.

An electric line of force from the source region 105 and the drain region 106 is terminated at the silicon substrate 110 through the buried oxide film 111. Therefore, junction capacitance between the source and drain regions 105 and 106 and the silicon substrate 110 becomes smaller and a current to charge this junction capacitance during an operation of a transistor is reduced, to ensure a faster operation and lower power consumption.

The background-art MOSFETs as above, however have the following problems.

First, the MOSFET using a bulk substrate, as compared with the MOSFET using an SOI substrate, disadvantageously operates more slowly and consumes larger power. Since the width W100 of a depletion layer 120 created by a pn junction between the source and drain regions 105 an 106 and the silicon substrate 101 is narrow, the junction capacitance between the source and drain regions 105 and 106 and the silicon substrate 101 becomes larger. As a result, it is necessary to charge the larger junction capacitance when the potentials of the source region 105 and the drain region 106 are varied during the operation of the transistor.

Next, the MOSFET using an SOI substrate, as compared with the MOSFET using a bulk substrate, disadvantageously performs more unstable operation. As shown in FIG. 22, the body region 113 is in an electrical floating state. Therefore, the potential of the body region 113 varies with variation in potential of the gate electrode 103, the source region 105 and the drain region 106. Such a variation in potential of a body region is specifically described in IEEE TRANSACTIONS ON ELECTRON DEVICES, VOL. 45, NO. 7, July 1998, pp 1479–1484, "Analysis of Delay Time Instability According to the Operating Frequency in Field Shield Isolated SOI Circuit" S. Maeda et al. (document 1). Specifically, the potential of the body region transiently varies and with this variation of potential, the characteristics of the transistor transiently varies, causing an unstable circuit operation (see FIG. 7 of the document 1).

Further, the document 1 shows a structure to fix the potential of the body region in order to ensure a stable circuit operation (see FIGS. 1 and 2 of the document 1). Since the structure of the document 1, however, needs a field shield isolated structure to fix the potential of the body region, a manufacturing process therefor becomes more complicate and requires longer time. To form the field shield isolated structure, it is necessary to form a field shield isolation layer which is not formed in a usual MOSFET using a bulk substrate. That needs a change of layout pattern between this MOSFET of the document 1 and the usual MOSFET using a bulk substrate.

SUMMARY OF THE INVENTION

The present invention is directed to a semiconductor device. According to a first aspect of the present invention, the semiconductor device comprises: a substrate; a first semiconductor layer formed on the substrate and having at least one cavity; a second semiconductor layer formed on the first semiconductor layer; and a semiconductor element formed on the second semiconductor layer. Preferably, the first semiconductor layer is a porous silicon layer.

According to a second aspect of the present invention, the semiconductor device comprises: a first semiconductor region of a first conductivity type; a first porous layer formed inside the first semiconductor region as a buried layer; and a source/drain region of a second conductivity type different from the first conductivity type, selectively formed in an upper surface of the first semiconductor region, and in the semiconductor device of the second aspect, a depletion layer created in a junction between the first semiconductor region and a bottom surface of the source/drain region can exist in the first porous layer.

Preferably, the first porous layer is a porous silicon layer.

According to a third aspect of the present invention, in the semiconductor device of the second aspect, the first semiconductor region has an epitaxial layer in its upper portion.

According to a fourth aspect of the present invention, in the semiconductor device of the second aspect, the bottom surface of the source/drain region is located adjacently above an upper surface of the first porous layer.

According to a fifth aspect of the present invention, in the semiconductor device of the second aspect, the bottom surface of the source/drain region is located adjacently below an upper surface of the first porous layer.

According to a sixth aspect of the present invention, in the semiconductor device of the second aspect, the first semiconductor region has a high-concentration impurity region of the first conductivity type which is located deeper than the first porous layer.

According to a seventh aspect of the present invention, the semiconductor device of the second aspect further comprises: a second semiconductor region of the second conductivity type formed adjacently to the first semiconductor region; a second porous layer formed inside the second semiconductor region as a buried layer, being connected to the first porous layer; and a trench-type isolation structure formed in an interface between the first semiconductor region and the second semiconductor region, extending deeper than bottom surfaces of the first and second porous layers from the upper surface of the first semiconductor region and an upper surface of the second semiconductor region.

The present invention is also directed to a method of manufacturing a semiconductor device. According to an eighth aspect of the present invention, the method comprises the steps of: (a) forming a first semiconductor region of a first conductivity type in which a first porous layer is formed as a buried layer; and (b) selectively forming a source/drain region of a second conductivity type different from the first conductivity type in an upper surface of the first semiconductor region, wherein a depletion layer created in a junction between the first semiconductor region and a bottom surface of the source/drain region can exist in the first porous layer.

Preferably, the first porous layer is a porous silicon layer.

Preferably, the porous silicon layer is formed by anodization.

According to a ninth aspect of the present invention, in the method of the eighth aspect, the step (a) has the steps of (a-1) forming the first porous layer; and (a-2) forming an epitaxial layer on an upper surface of the first porous layer.

According to a tenth aspect of the present invention, in the method of the eighth aspect, the step (b) has the steps of (b-1) introducing an impurity of the second conductivity type into the upper surface of the first semiconductor region; and (b-2) thermally diffusing the impurity introduced in the step (b-1), and in the method of the tenth aspect, a pn junction created in an interface between the first semiconductor region and the source/drain region at the completion of the step (b-1) is formed above the upper surface of the first porous layer.

According to an eleventh aspect of the present invention, in the method of the tenth aspect, the bottom surface of the source/drain region is located adjacently above the upper surface of the first porous layer at the completion of the step (b-2).

According to a twelfth aspect of the present invention, in the method of the tenth aspect, the bottom surface of the source/drain region is located adjacently below the upper surface of the first porous layer at the completion of the step (b-2).

According to a thirteenth aspect of the present invention, the method of the eighth aspect further comprises the step of: (c) forming a high-concentration impurity region of the first conductivity type at the depth deeper than the first porous layer in the first semiconductor region.

According to a fourteenth aspect of the present invention, in the method of the eighth aspect, a second semiconductor region of the second conductivity type is formed adjacently to the first semiconductor region in the step (a), and a second porous layer connected to the first porous layer is formed inside the second semiconductor region as a buried layer, and the method further comprises the step of: (d) forming a trench-type isolation structure in an interface between the first semiconductor region and the second semiconductor region, extending deeper than bottom surfaces of the first and second porous layers from the upper surface of the first semiconductor region and an upper surface of the second semiconductor region.

In the semiconductor device of the first aspect, the porous layer can be used as a In the semiconductor device of the first aspect, the first semiconductor layer can be used as a stopper for polishing when the substrate is polished by CMP from its backside. Further, the first semiconductor layer can be used as a stopper for etching when the substrate is etched from its backside. Furthermore, the first semiconductor layer is used as a boundary to remove the second semiconductor layer in which the semiconductor element is formed from the substrate and the relative dielectric constant of the depletion layer existing in the porous layer is smaller than that in the bulk substrate, the junction capacitance can be reduced. Therefore, a faster operation and lower power consumption in the semiconductor device can be achieved. Since the potential of the first semiconductor region above the first porous layer can be fixed from the backside of the first semiconductor region with the first porous layer interposed, unlike the semiconductor device using an SOI substrate, a stable operation of the semiconductor device can be ensured.

In the semiconductor device of the third aspect, the source/drain region can be formed in the epitaxial layer.

In the semiconductor device of the fourth aspect, since the bottom surface of the source/drain region is located adjacently above the upper surface of the first porous layer, the depletion layer created in the junction between the first semiconductor region and the bottom surface of the source/drain region can exist in the first porous layer.

In the semiconductor device of the fifth aspect, since the bottom surface of the source/drain region is located adjacently below the upper surface of the first porous layer, the depletion layer created in the junction between the first semiconductor region and the bottom surface of the source/drain region can exist in the first porous layer.

In the semiconductor device of the sixth aspect, since the high-concentration impurity region has a low resistance, it is possible to suppress a latchup. Moreover, when the potential of the first semiconductor region above the first porous layer is fixed from the backside of the first semiconductor region with the first porous layer interposed, the high resistance of the first porous layer can be relieved by the low resistance of the high-concentration impurity region, to further enhance the stability in operation of the semiconductor device.

In the semiconductor device of the seventh aspect, since the trench-type isolation structure is formed deeper than the bottom surfaces of the first and second porous layers, it is possible to avoid formation of the pn junction created in the interface between the first semiconductor region and the second semiconductor region in the first and second porous layers.

In the method of the eighth aspect, since the width of the depletion layer becomes larger than that in the semiconductor device using a bulk substrate and the relative dielectric constant of the depletion layer existing in the porous layer is smaller than that in the bulk substrate, the junction capacitance can be reduced. Therefore, a faster operation and lower power consumption in the semiconductor device can be achieved. Since the potential of the first semiconductor region above the first porous layer can be fixed from the backside of the first semiconductor region with the first porous layer interposed, unlike the semiconductor device using an SOI substrate, a stable operation of the semiconductor device can be ensured.

In the method of the ninth aspect, the source/drain region can be formed in the epitaxial layer.

In the method of the tenth aspect, it is possible to avoid the case where the impurity implanted into the porous portion of the first porous layer goes through the first porous layer to form the pn junction below the bottom surface of the first porous layer.

In the method of the eleventh aspect, since the bottom surface of the source/drain region is located adjacently above the upper surface of the first porous layer, the depletion layer created in the junction between the first semiconductor region and the bottom surface of the source/drain region can exist in the first porous layer.

In the method of the twelfth aspect, since the bottom surface of the source/drain region is located adjacently below the upper surface of the first porous layer, the depletion layer created in the junction between the first semiconductor region and the bottom surface of the source/drain region can exist in the first porous layer.

In the method of the thirteenth aspect, since the high-concentration impurity region has a low resistance, it is possible to suppress a latchup. Moreover, when the potential of the first semiconductor region above the first porous layer is fixed from the backside of the first semiconductor region with the first porous layer interposed, the high resistance of the first porous layer can be relieved by the low resistance of the high-concentration impurity region, to further enhance the stability in operation of the semiconductor device.

In the method of the fourteenth aspect, since the trench-type isolation structure is formed deeper than the bottom surfaces of the first and second porous layers, it is possible to avoid formation of the pn junction created in the interface between the first semiconductor region and the second semiconductor region in the first and second porous layers.

An object of the present invention is to provide a semiconductor device which allows a faster operation and lower power consumption while ensuring a stable operation of a MOSFET and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
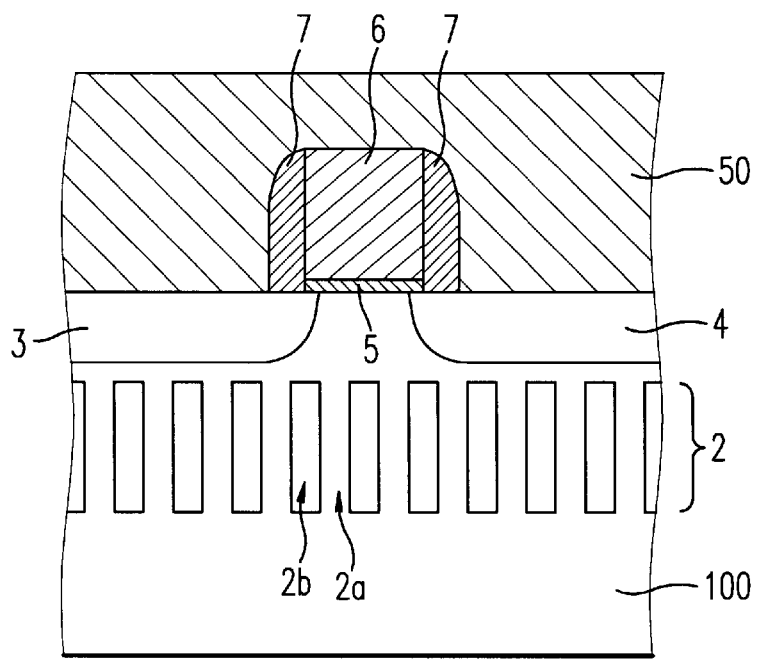
FIG. 1 is a cross section showing a structure of a semiconductor device in accordance with the present invention.

FIG. 1 is a cross section showing a structure of a semiconductor device in accordance with the present invention. The semiconductor device of FIG. 1 comprises a silicon substrate 100, a porous silicon layer 2 formed inside the silicon substrate 100, having a silicon portion 2a and a porous portion 2b, and a semiconductor element formed in the silicon substrate 100 above the porous silicon layer 2. In the example of FIG. 1, as the semiconductor element, a MOSFET having a source region 3, a drain region 4, a gate oxide film 5, a gate electrode 6 and sidewalls 7 is formed. Further, the semiconductor device of FIG. 1 comprises an insulating film 50 formed on the semiconductor element.

Figure 2:
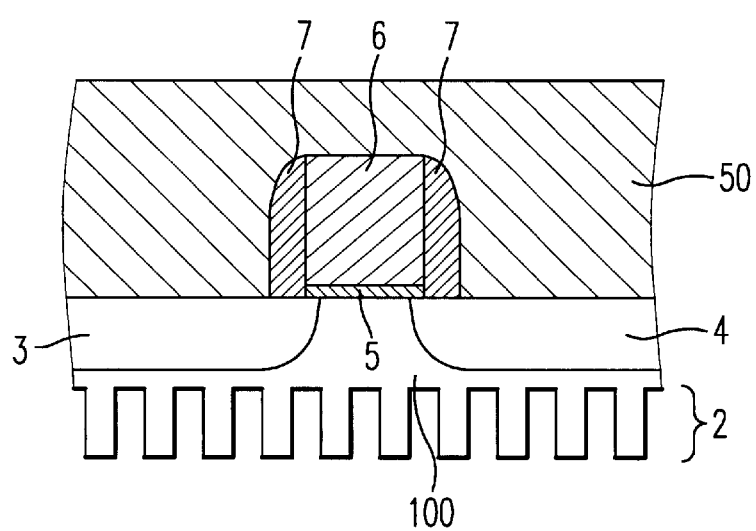
FIGS. 2 and 3 are cross sections for explanation of an effect of the semiconductor device shown in FIG. 1.
Figure 3:
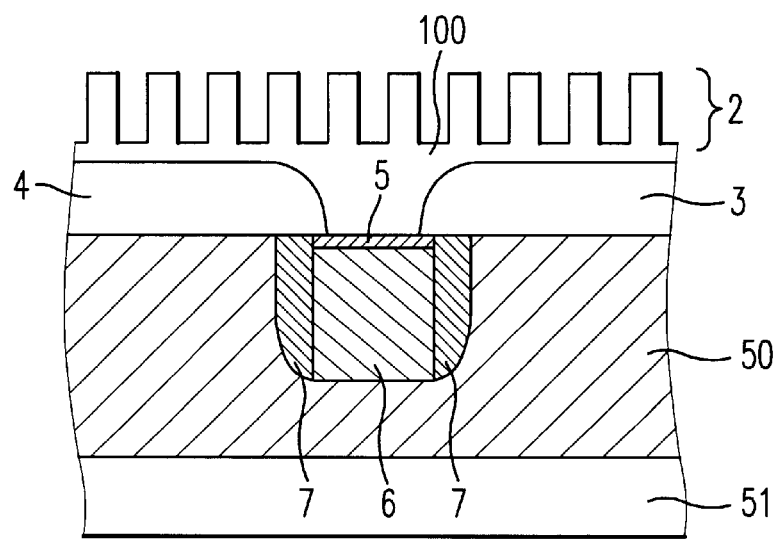

FIGS. 2 and 3 are cross sections for explanation of an effect of the semiconductor device shown in FIG. 1. As shown in FIG. 1, the porous silicon layer 2 is formed inside the silicon substrate 1. Therefore, when the silicon substrate 100 is polished from its backside by CMP (Chemical Mechanical Polishing), the porous layer 2 can be used as a stopper for the polishing. Further, when the silicon substrate 100 is etched from its backside, the porous silicon layer 2 can be used as a stopper for etching. Furthermore, the porous silicon layer 2 is used as a boundary to remove the semiconductor element and the insulating film 50 from the silicon substrate 100 below the porous silicon layer 2 (see FIG. 2).

Therefore, as shown in FIG. 3, it is possible to bond the semiconductor element, having had the silicon substrate 100 shown in FIG. 1 below the porous silicon layer 2 removed by polishing or etching, to a support. substrate 51 such as silicon, quartz and plastic with the insulating film 50 interposed therebetween.

Hereafter, a specific preferred embodiment of the semiconductor device in accordance with the present invention will be discussed.

THE FIRST PREFERRED EMBODIMENT

Figure 4:
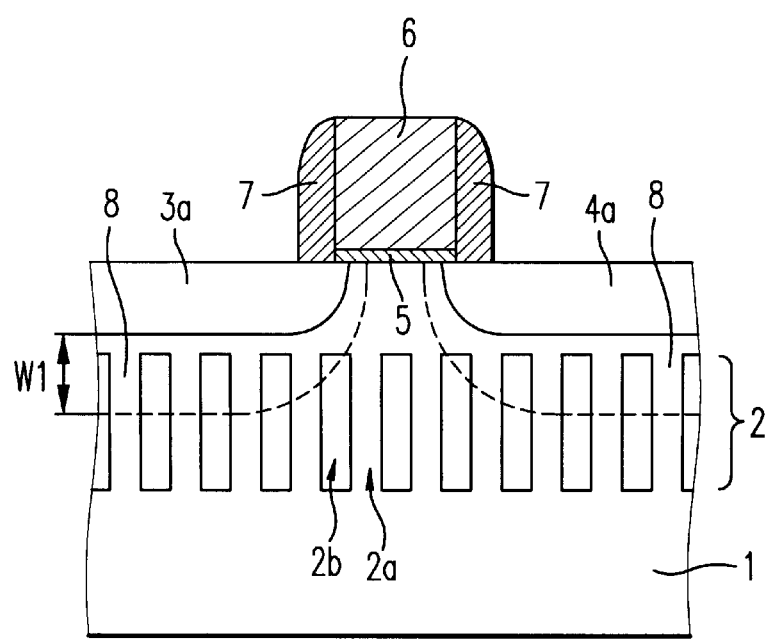
FIGS. 4 and 5 are cross sections each showing a structure of a semiconductor device in accordance with a first preferred embodiment of the present invention.
Figure 5:
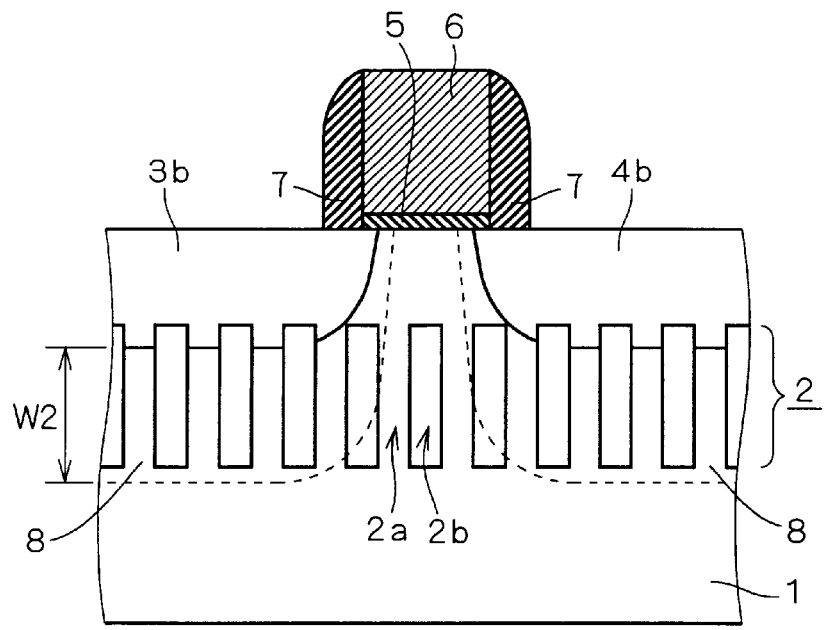

FIGS. 4 and 5 are cross sections each showing a structure of a semiconductor device in accordance with the first preferred embodiment of the present invention. The semiconductor devices of FIGS. 4 and 5 each comprise a silicon region 1 of a first conductivity type and the porous silicon layer 2 formed inside the silicon region 1 as a buried layer. The semiconductor device of FIG. 4 comprises a source region 3a and a drain region 4a and the semiconductor device of FIG. 5 comprises a source region 3b and a drain region 4b. The source regions 3a and 3b and the drain regions 4a and 4b are each of a second conductivity type different from the first conductivity type and selectively formed in an upper surface of the silicon region 1. The porous silicon layer 2 has the silicon portion 2a and the porous region 2b.

The semiconductor devices of FIGS. 4 and 5 each comprise a multi-layered structure consisting of the gate oxide film 5 and the gate electrode 6 layered in this order which is selectively formed on the upper surface of the silicon region 1 and the sidewalls 7 formed on side surfaces of the gate oxide film 5 and the gate electrode 6.

In the semiconductor device of FIG. 4, bottom surfaces of the source region 3a and the drain region 4a are located adjacently above an upper surface of the porous silicon layer 2. In the semiconductor device of FIG. 5, the bottom surfaces of the source region 3b and the drain region 4b are located adjacently below the upper surface of the porous silicon layer 2. As a result, in the semiconductor device of FIGS. 4 and 5, a depletion layer 8 created in the pn junction between the silicon region 1 and the bottom surfaces of the source and drain regions 3a, 3b, 4a and 4b also exists in the porous silicon layer 2.

Figure 6:
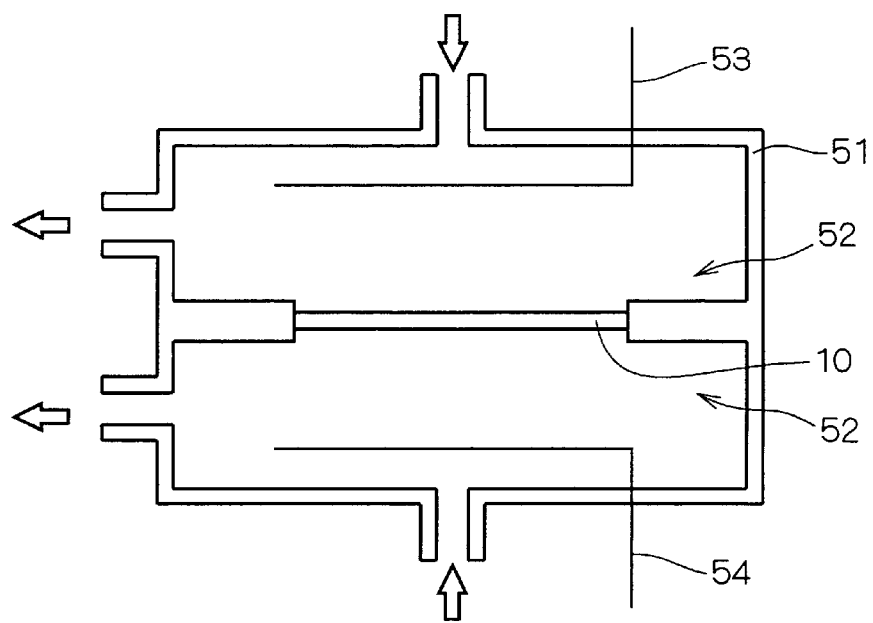
FIGS. 6 to 19 are cross sections showing a method of manufacturing a semiconductor device in accordance with the first preferred embodiment of the present invention step by step in the order of process.
Figure 7:
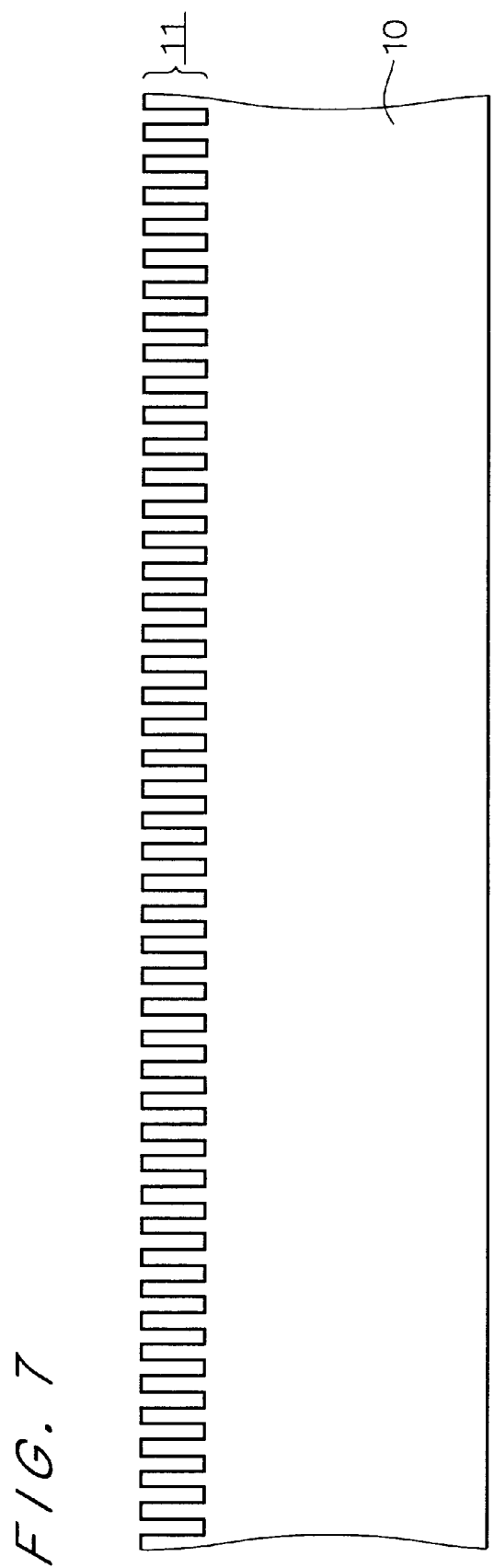

Hereinafter, taking a case of manufacturing a CMOS as an example, a method of manufacturing the semiconductor device of FIG. 5 will be discussed step by step in the order of process. FIGS. 6 to 19 are cross sections showing a method of manufacturing a semiconductor device in accordance with the first preferred embodiment of the present invention step by step in the order of process. A porous silicon layer 11 is formed by anodization in an upper surface of an n-type silicon substrate 10. Specifically, the silicon substrate 10 is dipped into HF solution 52 in an anodization cell 51 and a current is passed through the silicon substrate 10 by using an upper platinum electrode 53 as cathode and a lower platinum electrode as anode (see FIG. 6) under a condition that an anodization time is 30 seconds and an anodization current density is 10mA/cm$^2$. This makes the upper surface of the silicon substrate 10 porous and in the upper surface of the silicon substrate 10, the porous silicon layer 11 having a thickness of about 0.2 m is thereby formed (see. FIG. 7).

Figure 8:
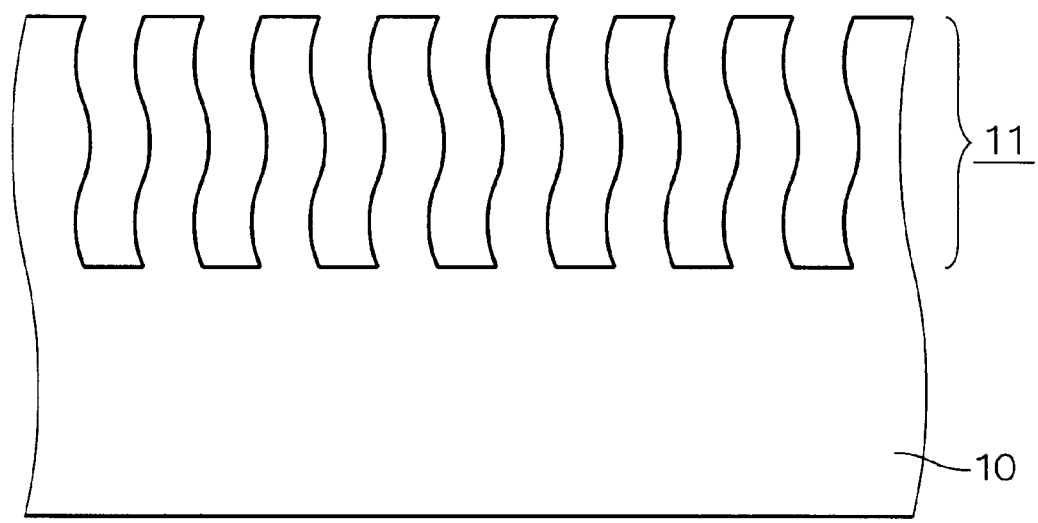
Figure 9:
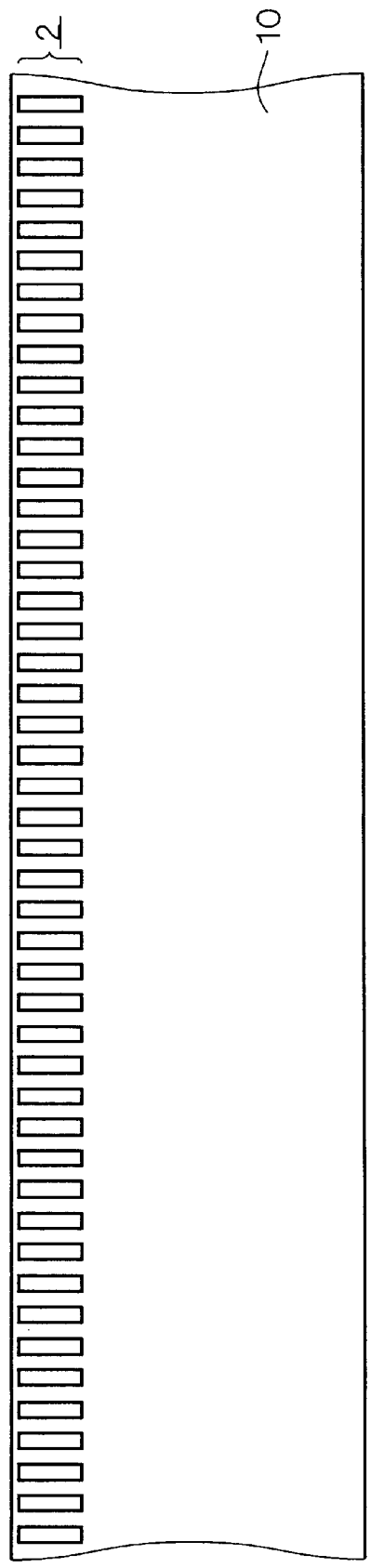
Figure 10:
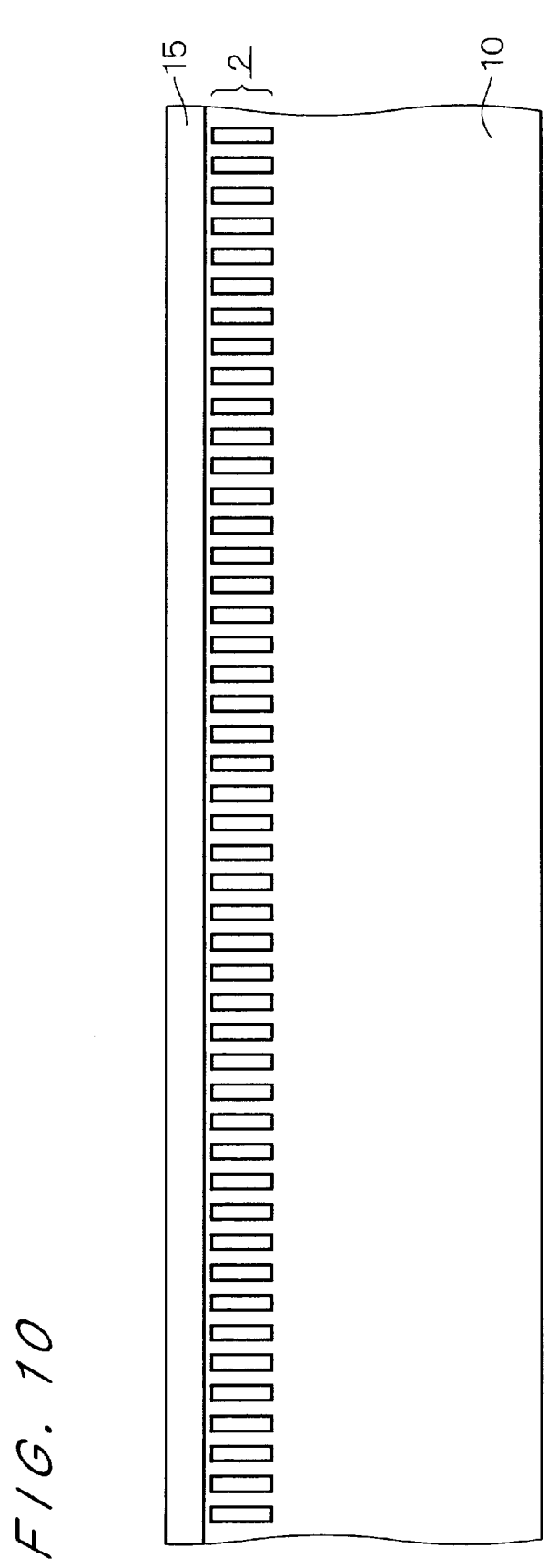

FIG. 8 is a cross section specifically showing a shape of the porous silicon layer 11. Though the porous silicon layer 11 has a complicated shape as shown in FIG. 8, more specifically as shown in FIG. 4 of a later-discussed document 3, pp. 470 or FIG. 2 of a later-discussed document 4, pp. 379, a simplified shape of the porous silicon layer 11 is shown in this specification as shown in FIG. 7. Further, as shown in "SOI Structure Forming Technique, pp. 181 to 185, by Seijiro Furukawa, 1987, Sangyotosho" (document 2), the thickness of the porous silicon layer 11 can be controlled by the anodization time and the anodization current density and the density of the porous silicon layer 11 (corresponding to a ratio of the silicon portion 2a and the porous portion 2b) can be controlled by the concentration of the HF solution 52. All the disclosures of the document 2 are herein incorporated by reference in this specification.

Next, to ensure stability in porous structure of the porous silicon layer 11 against a heat treatment, a preliminary oxidation is performed at a low temperature of about 400° C. Subsequently, to reduce the amount of crystal defects of an epitaxial layer 15 formed in a later step, a heat treatment is performed at a temperature of over 1000° C. for a few seconds in a hydrogen atmosphere. Then, the mobility of surface atoms is remarkably enhanced by minimization of surface energy of the porous silicon layer 11, and surface holes (not shown) created by natural oxidation in the upper surface of the porous silicon layer 11 are removed by reduction. As a result, the upper surface of the porous silicon layer 11 is sufficiently smoothened, to form the porous silicon layer 2 (see FIG. 9).

The upper surface of the porous silicon layer 2 maintains a single crystalline structure of the silicon substrate 10 and has the same crystal orientation as the silicon substrate 10. Next, the epitaxial layer 15 is formed to have a thickness of about 100 nm on the upper surface of the porous silicon layer 2 by epitaxial development method (see FIG. 10). The epitaxial development of silicon onto the porous silicon layer is specifically disclosed in "Science of Silicon", pp. 467 to 475, supervised by Tadahiro Ohmi and others, published by REALIZE INC. (document 3), "IEICE TRANS. ELECTRON", vol. E80-C, No.3, March 1997, K. SAKAGUCHI et al. pp. 378 to 387 (document 4), and "Extended Abstracts of the 1998 International Conference on Solid State Devices and Materials", Hiroshima, 1998, pp. 302 to 303 (document 5). All the disclosures of the documents 3 to 5 are herein incorporated by reference in this specification.

Figure 11:
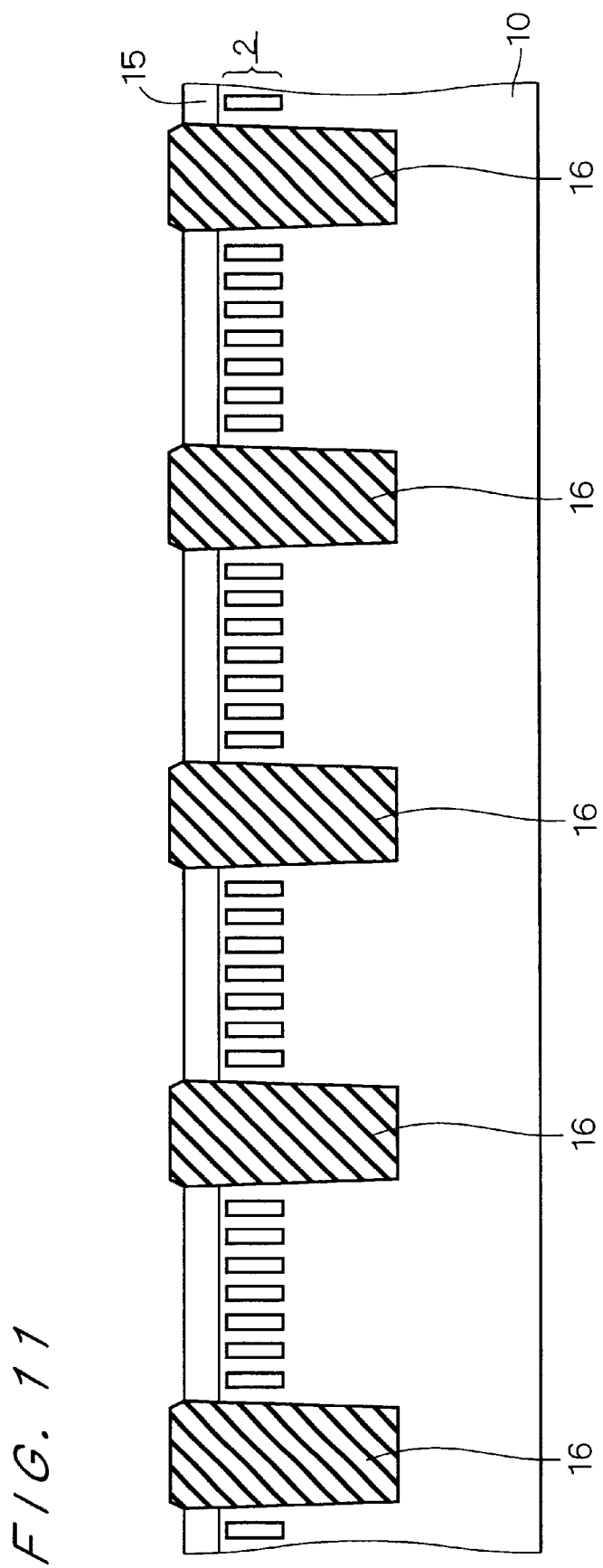
Figure 12:
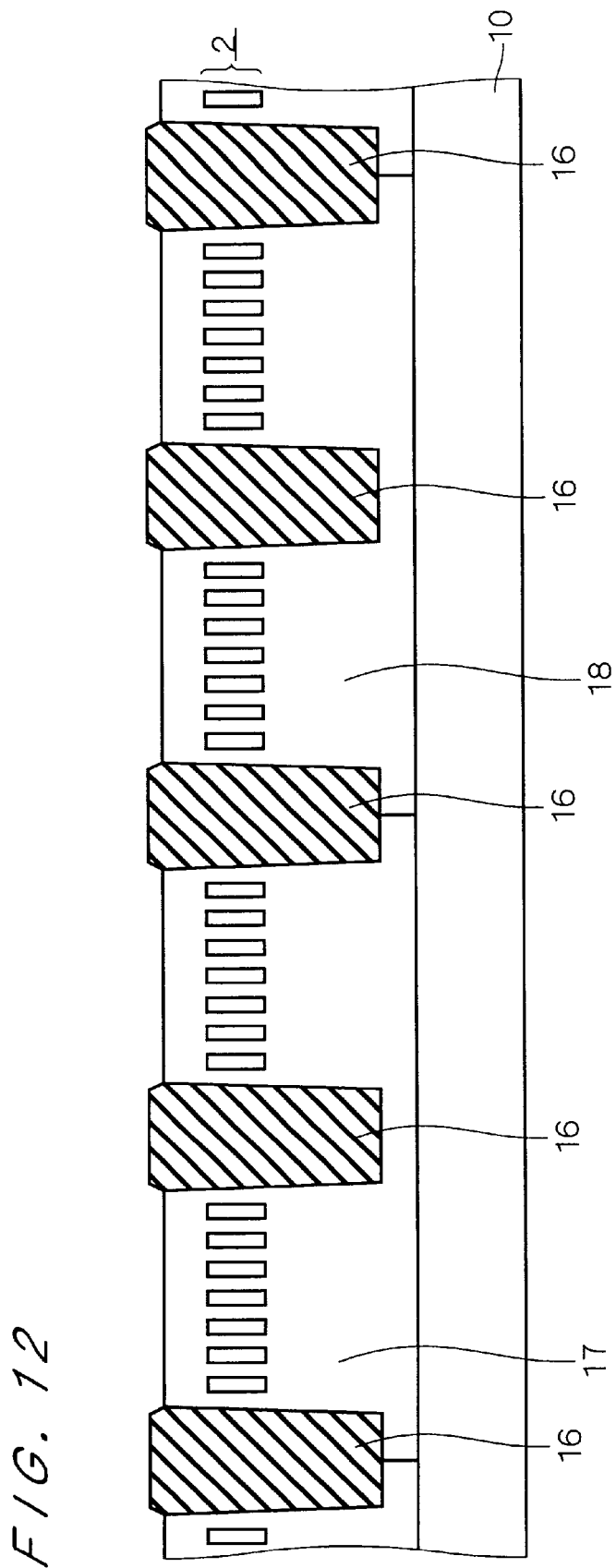

A trench-type isolation structure 16 is selectively formed to have a depth of about 0.3 to 0.4 μm from the upper surface of the epitaxial layer 15 (see FIG. 11). As shown in FIG. 11, the trench-type isolation structure 16 goes through the porous silicon layer 2 and reaches inside of the silicon substrate 10. Next, a p well 17 and an n well 18 are formed by ion implantation and thermal diffusion (see FIG. 12). The p well 17 and the n well 18 correspond to the silicon region 1 shown in FIGS. 4 and 5. Subsequently, the ion implantation and the thermal diffusion are performed to form a p-type high-concentration impurity region 19 and an n-type high-concentration impurity region 20 in bottom portions of the p well 17 and the n well 18, respectively (see FIG. 13). The gate structure consisting of the gate oxide film 5, the gate electrode 6 and sidewalls 7 is selectively formed on upper surfaces of the p well 17 and the n well 18 (see FIG. 14).

Figure 15:
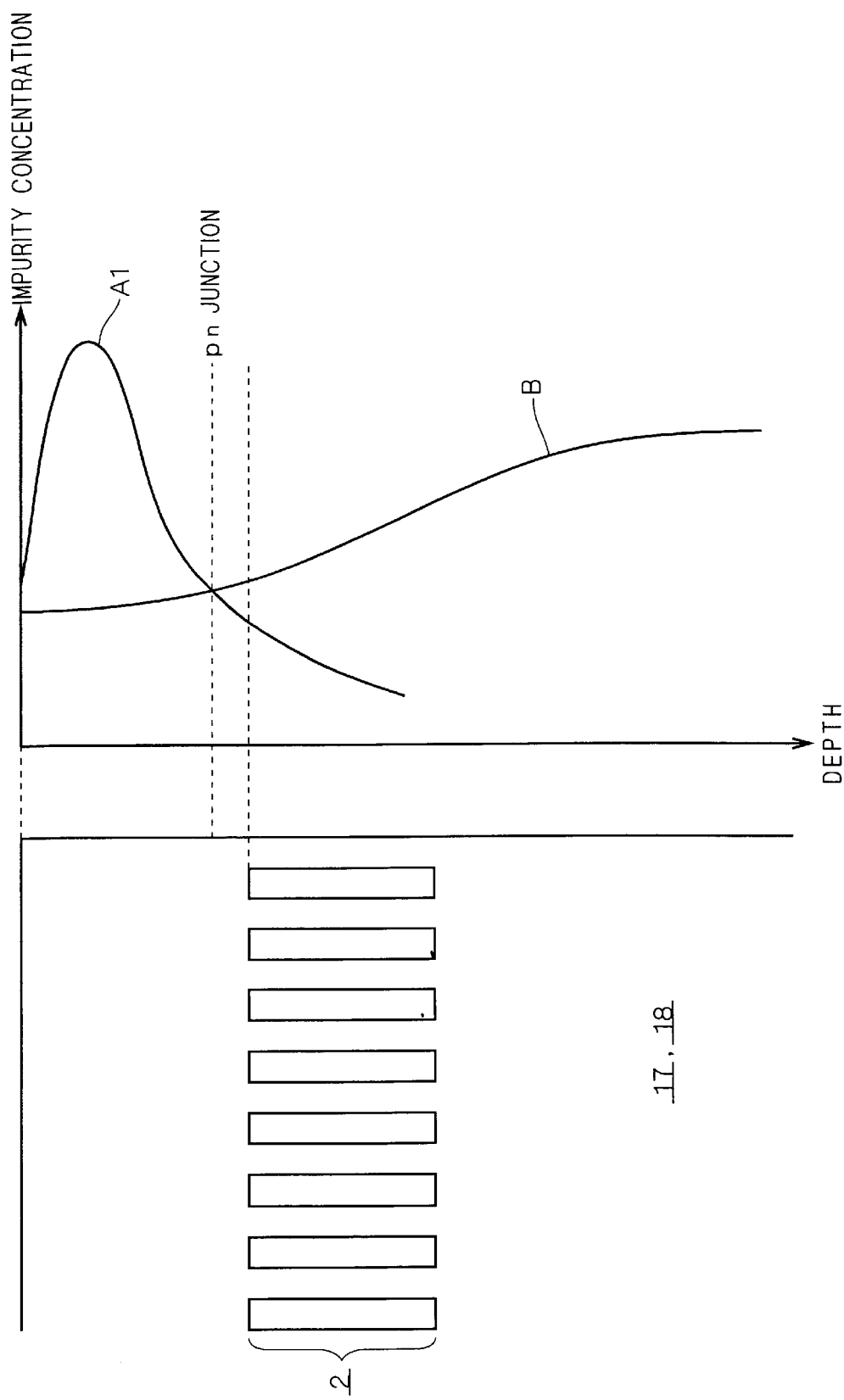

Next, an n$^+$-type impurity and a p$^+$-type impurity are introduced by the ion implantation into the upper surfaces of the p well 17 and the n well 18, respectively. FIG. 15 shows an impurity concentration profile immediately after the ion implantation. In FIG. 15, a curve A1 indicates a concentration distribution of the implanted n$^+$-type or p$^+$-type impurity, and a curve B indicates a concentration distribution of a p-type impurity in the p well 17 or an n$^-$-type impurity in the n well 18. A pn junction is created at the depth where the curves A1 and B cross, and an implantation energy of the n$^+$-type impurity and the p$^+$-type impurity is controlled so that the pn junction may be created at the depth shallower than the upper surface of the porous silicon layer 2.

Figure 16:
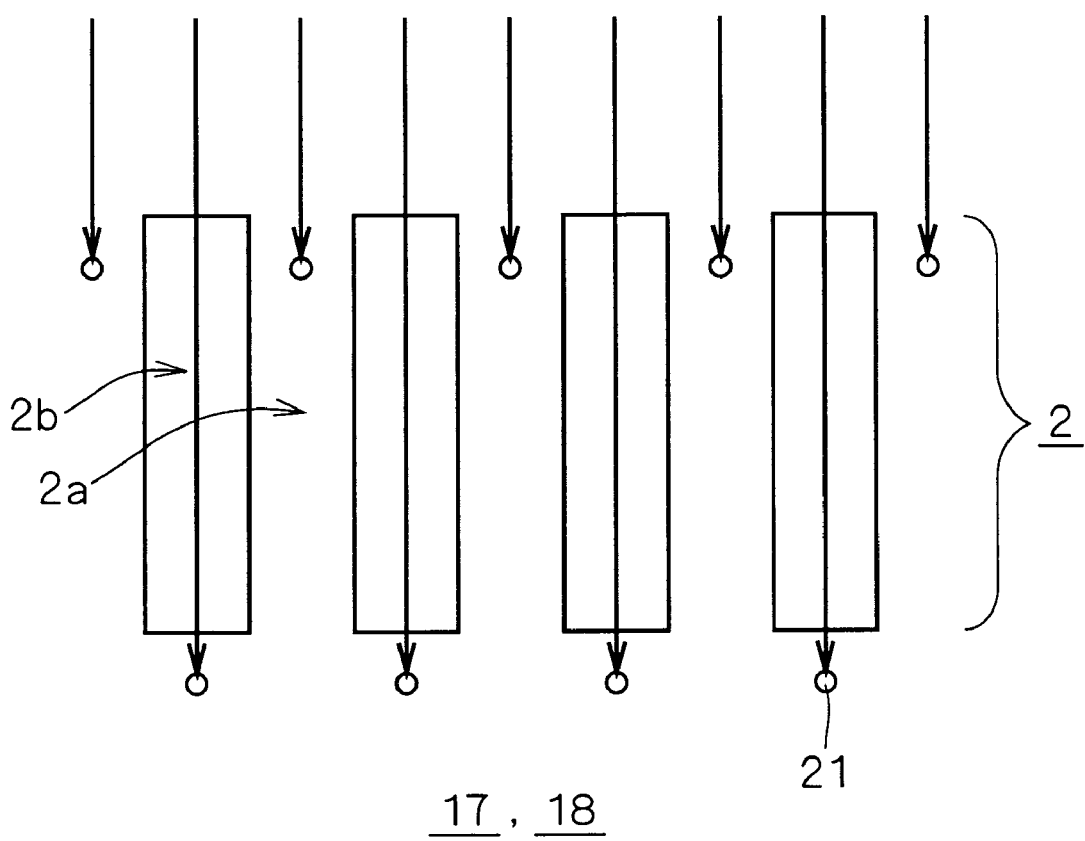
Figure 17:
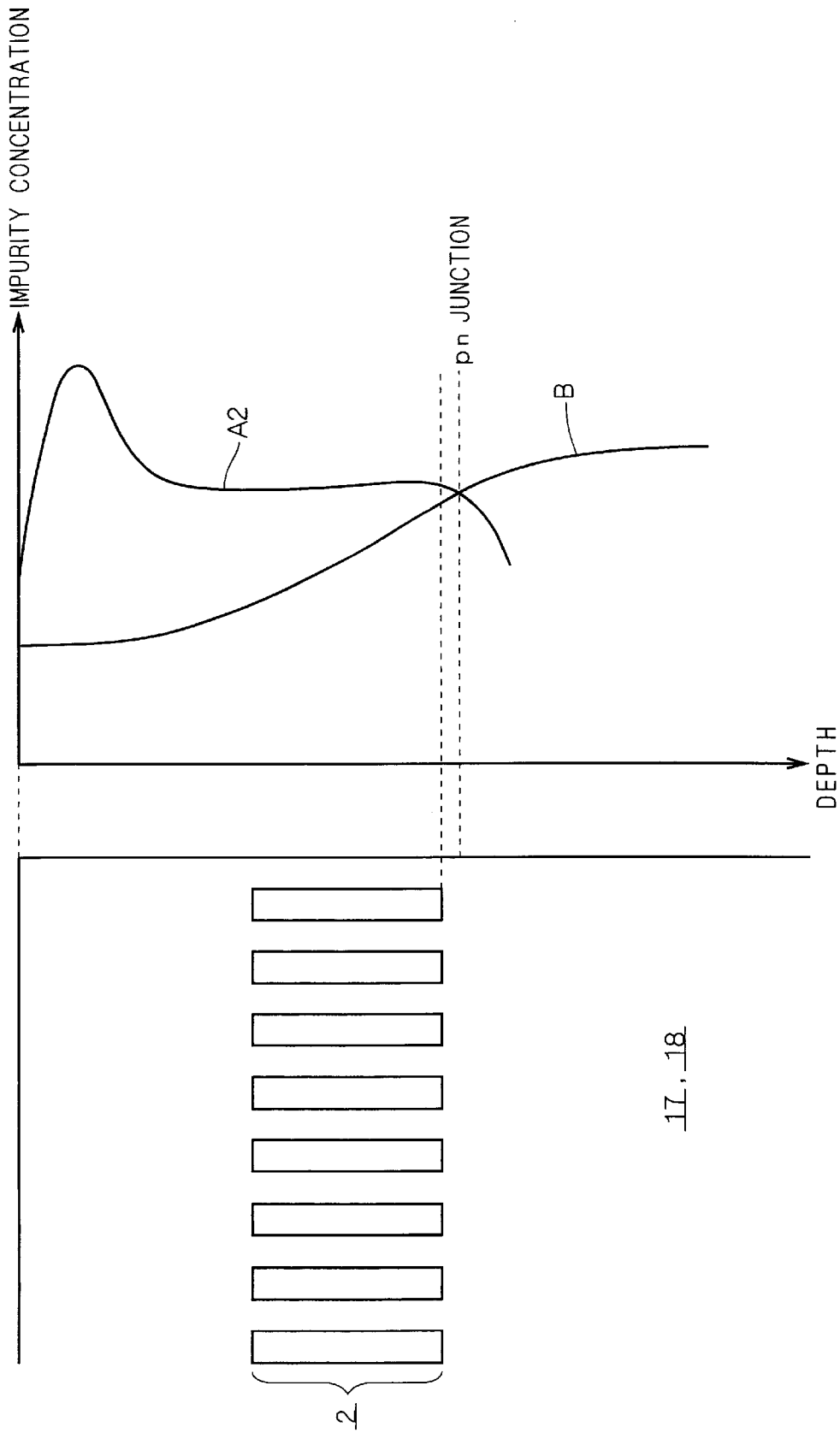

When the implantation energy of the n$^+$-type impurity and the p$^+$-type impurity is too great for the thickness of the epitaxial layer 15, the following ill effect rises. As shown in FIG. 16, an impurity 21 implanted into the porous portion 2b of the porous silicon layer 2 reaches a lower portion of the porous silicon layer 2 without any resistance. In this case, an impurity concentration profile immediately after the ion implantation is such as shown in FIG. 17, and the pn junction is created at the depth deeper than the bottom surface of the porous silicon layer 2. Then, the width of a depletion layer created in the pn junction is as small as that of the background-art MOSFET using a bulk substrate. As a result, junction capacitance is as large as, or larger than the background-art MOSFET using a bulk substrate because the pn junction is formed deeper, and the operation speed of the MOSFET is deteriorated. By the method of manufacturing a semiconductor device of the first preferred embodiment, however, the implantation energy can be controlled so that the pn junction immediately after ion implantation may be formed at the depth shallower than the upper surface of the porous silicon layer 2 as discussed above. This avoids the above problem.

Figure 18:
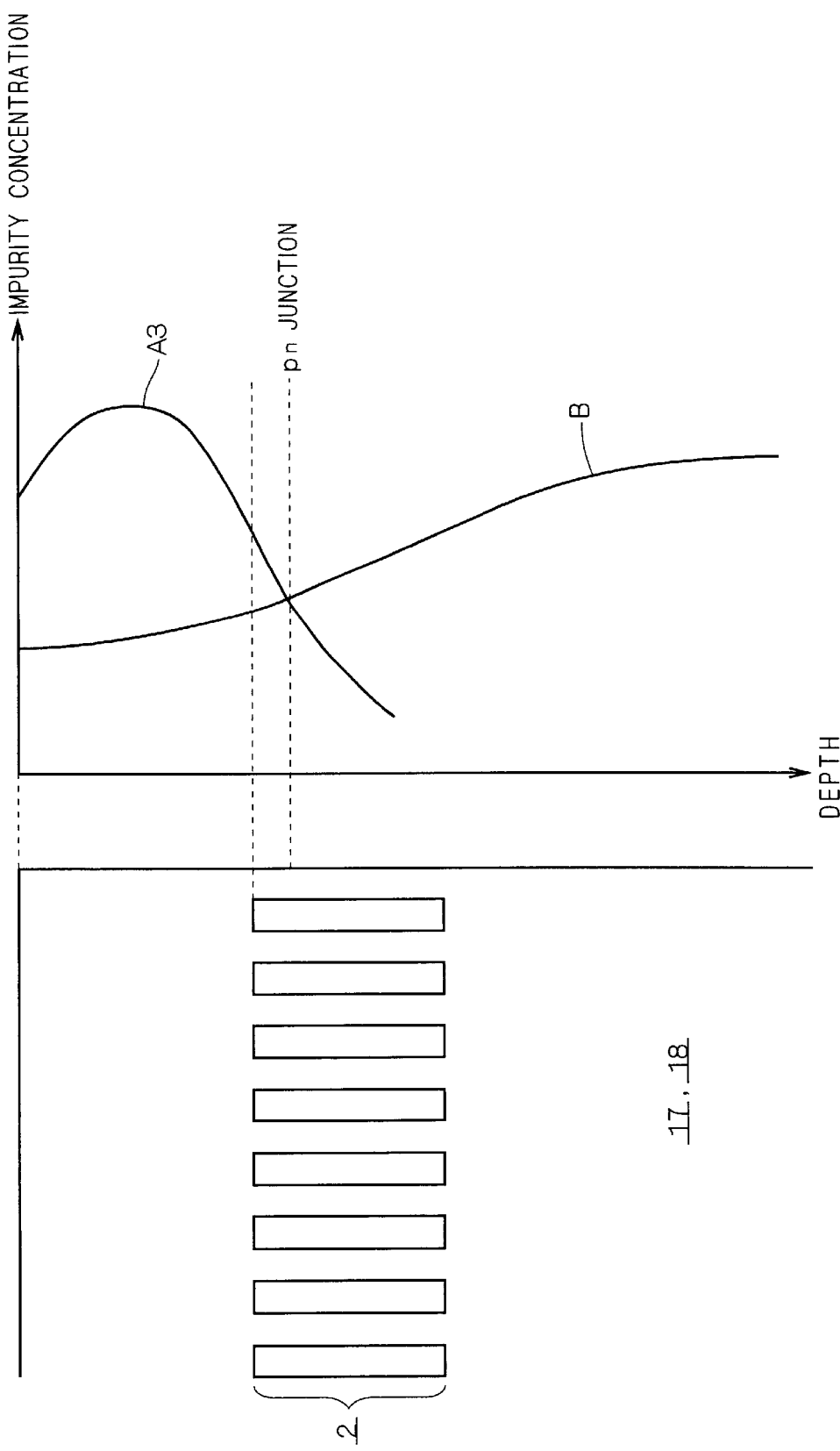

Next, a heat treatment is performed. When the heat treatment is performed for such a long time as the n$^+$-type impurity and the p$^+$-type impurity are thermally diffused into the inside of the porous silicon layer 2, the impurity concentration profile after heat treatment is such as shown in FIG. 18. As shown in FIG. 18, the pn junction is formed at the depth deeper than the upper surface of the porous silicon layer 2. This heat treatment for a long time allows the source region 3b and the drain region 4b as shown in FIG. 5 to be formed (see FIG. 19). It is preferable to perform a heat treatment such that the pn junction may be formed immediately below the upper surface of the porous silicon layer 2.

On the other hand, a heat treatment may be performed for such a short time as the n$^+$-type impurity and the p$^+$-type impurity are not thermally diffused into the inside of the porous silicon layer 2. In this case, the source region 3a and the drain region 4a as shown in FIG. 4 can be formed, though it is necessary to perform a heat treatment such that the bottom surfaces of the source region 3a and the drain region 4a may exist adjacently to the upper surface of the porous silicon layer 2 so that the depletion layer to be created in the pn junction may reach the porous silicon layer 2.

In the above discussion, a process of manufacturing a CMOS is taken as an example to show a case where both a PMOS and an NMOS are formed in the silicon substrate. Alternatively, the present invention can be applied to a case where either of the PMOS and NMOS is formed. Further, in the above case, it goes without saying that the PMOS and the NMOS may be replaced with each other. Furthermore, exemplary film thickness, process condition and the like are shown in the above discussion, and other numerals and condition may be adopted.

Figure 19:
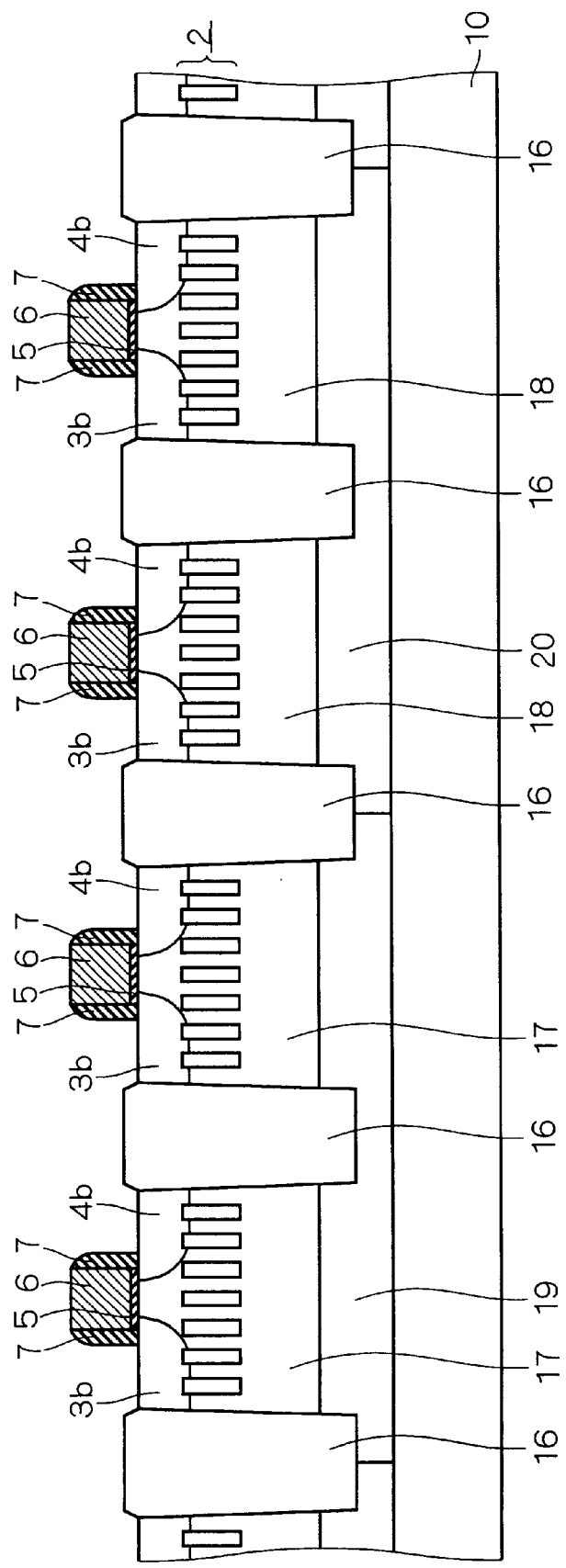
Figure 20:
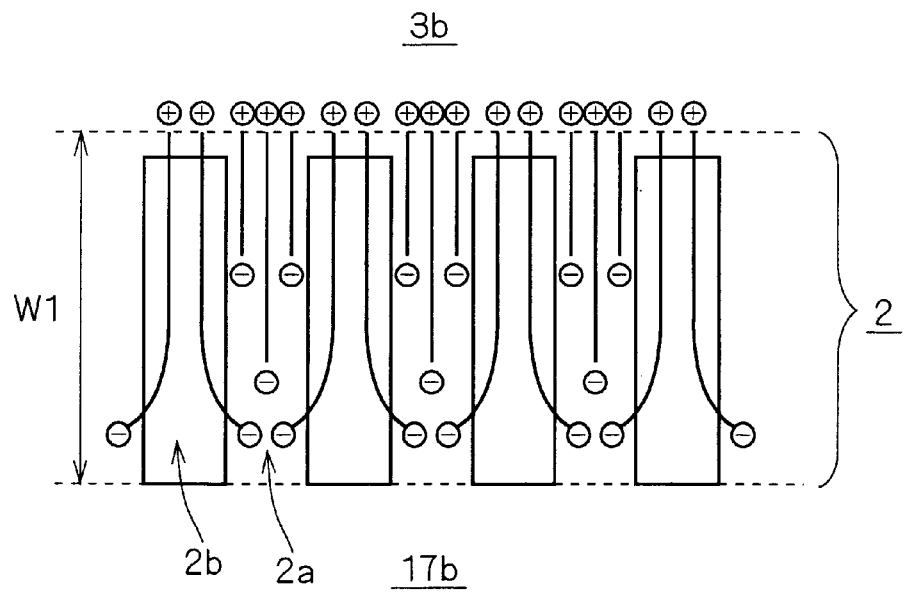
FIG. 20 is a schematic view for explanation of an effect the semiconductor device in accordance with the first preferred embodiment of the present invention.
Figure 21:
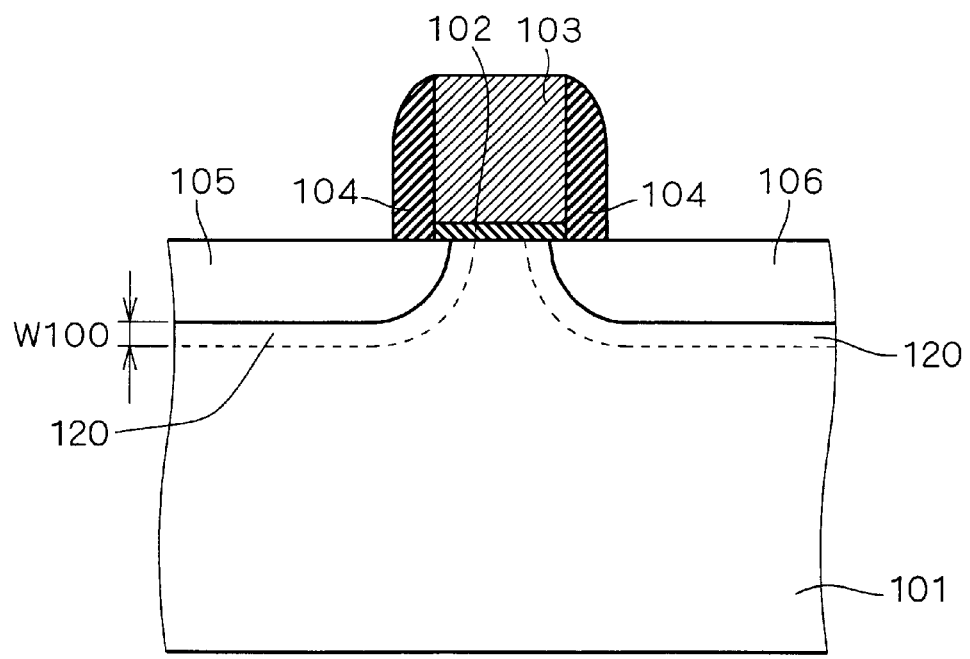
FIG. 21 is a cross section showing a structure of a MOSFET using a bulk substrate in the background art.

Thus, in the semiconductor device and the method of manufacturing the same of the first preferred embodiment, as shown in FIGS. 4 and 5, the depletion layer 8 created in the pn junction between the silicon region 1 and the bottom surfaces of the source regions 3a and 3b and the drain regions 4a and 4b also exists in the porous silicon layer 2. Therefore, the widths W1 and W2 of the depletion layers 8 become larger than the width W100 of the depletion layer 120 in the background-art MOSFET using a bulk substrate (of FIG. 21). Moreover, the electric line of force is not terminated in the porous portion 2b of the porous silicon layer 2 as shown in FIG. 20, which causes the depletion layer in the silicon portion 2a to be further widened. The relative dielectric constant of the depletion layer 120 is about 11.7 while the effective relative dielectric constant of the depletion layer 8 with the silicon portion 2a and the porous portion 2b mixed at a ratio of one to one is about 5.85 which is almost half of that of the depletion layer 120. For the above reasons, in the semiconductor device and the method of manufacturing the same of the first preferred embodiment, it is possible to reduce the junction capacitance and ensure a faster operation of the transistor and lower power consumption. This effect is prominent when the source region 3b and the drain region 4b are formed with their bottom surfaces existing immediately below the upper surface of the porous silicon layer 2 as shown in FIGS. 5 and 19, for the effect of reducing the junction capacitance is achieved with more reliability.

Figure 22:
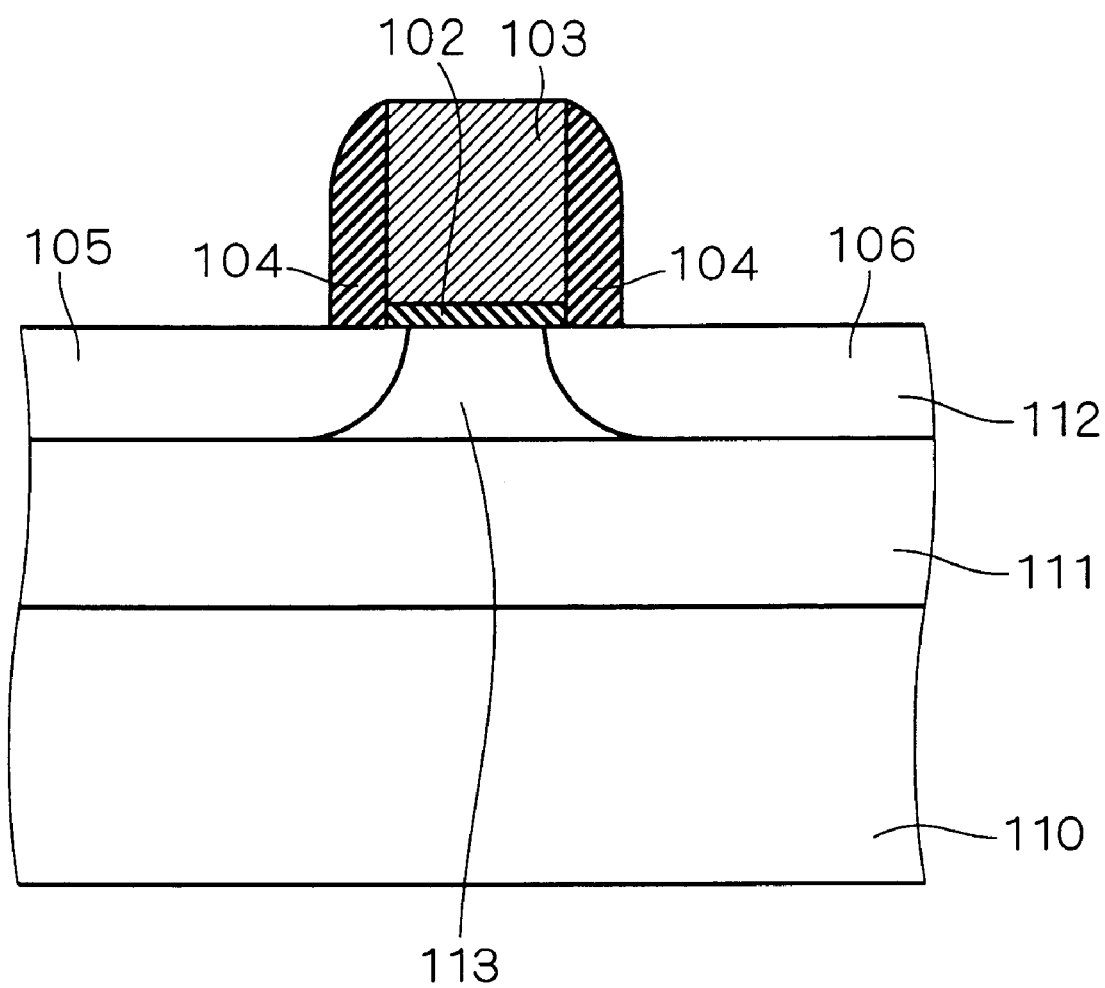
FIG. 22 is a cross section showing a structure of a MOSFET using an SOI substrate in the background art.

Further, as shown in FIGS. 4 and 5, the potentials of the channel regions between the source regions 3a and 3b and the drain regions 4a and 4b, respectively, can be fixed from the backside of the silicon region 1 with the silicon portion 2a of the porous silicon layer 2 interposed. Therefore, the operation of the transistor can be stabilized unlike in the background-art MOSFET using an SOI substrate (of FIG. 22).

Furthermore, when the potentials of the channel regions is fixed, it is not necessary to form a particular structure such as a field shield isolated structure. Therefore, this device needs no complicated process and not so many steps for manufacture, and further no change of layout pattern between this MOSFET and the usual MOSFET using a bulk substrate.

As shown in FIG. 11, the trench-type isolation structure 16 is formed at such a depth as to go through the porous silicon layer 2 and reach the inside of the silicon substrate 10. Therefore, the pn junction later created in the interface between the p well 17 and the n well 18 is not formed in the porous silicon layer 2. Since the p well 17 and the n well 18 can be formed closely without necessity for increasing the width of isolation between these wells 17 and 18, no increase in chip area is caused. Moreover, no change of layout pattern between this MOSFET and the usual MOSFET using a bulk substrate is needed.

Figure 13:
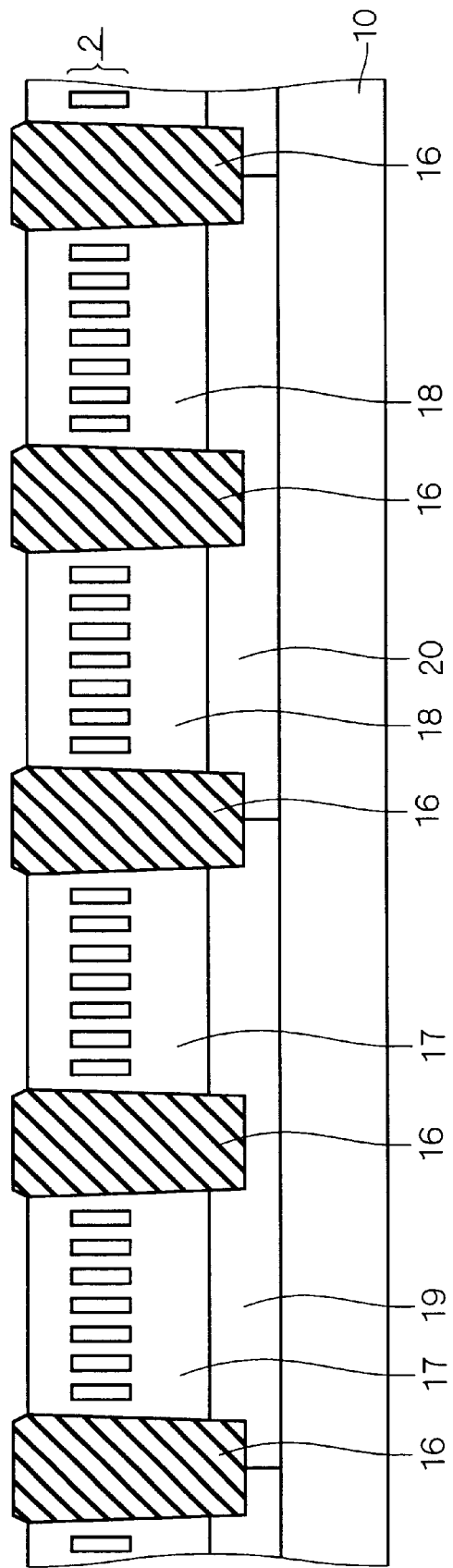
Figure 14:
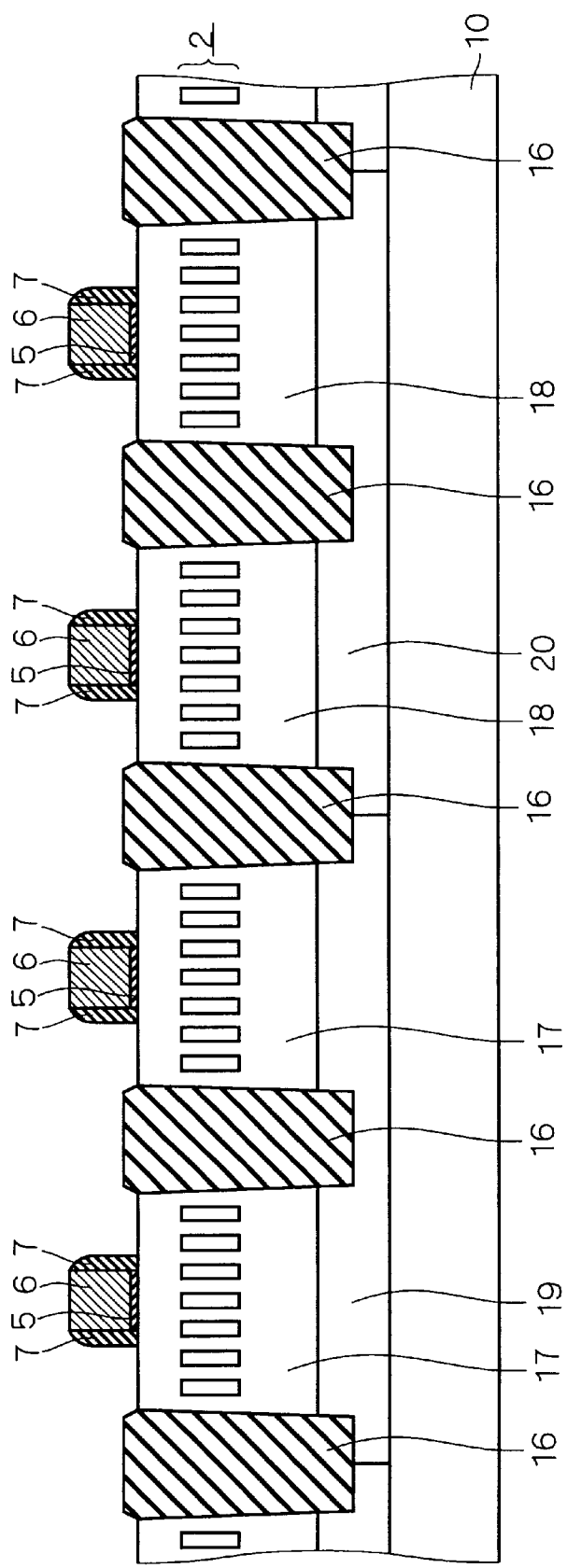

As shown in FIG. 13, the p-type high-concentration impurity region 19 and the n-type high-concentration impurity region 20 are formed in the bottom portions of the p well 17 and the n well 18, respectively. Therefore, it is possible to suppress latchup since the high-concentration impurity regions 19 and 20 have low resistances. Moreover, when the potential of the channel region is fixed from the backside of the silicon substrate 10 with the porous silicon layer 2 interposed, the high resistance of the porous silicon layer 2 is relieved by the low resistances of the high-concentration impurity regions 19 and 20, to further enhance the stability in the operation of the transistor.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a substrate;
   a first semiconductor layer formed on said substrate and having at least one cavity;
   a second semiconductor layer formed on top of and directly in contact with said first semiconductor layer, said at least one cavity extending at least to said second semiconductor layer; and
   a semiconductor element formed in said second semiconductor layer.

2. The semiconductor device according to claim 1, wherein said first semiconductor layer is a porous silicon layer.

3. A semiconductor device, comprising:
   a first semiconductor region of a first conductivity type;
   a first porous layer formed inside said first semiconductor region as a buried layer; and
   a source/drain region of a second conductivity type different from said first conductivity type, selectively formed in an upper surface of said first semiconductor region,
   wherein a depletion layer created in a junction between said first semiconductor region and a bottom surface of said source/drain region can exist in said first porous layer.

4. The semiconductor device according to claim 3, wherein
   said first porous layer is a porous silicon layer.

5. The semiconductor device according to claim 3, wherein
   said first semiconductor region has an epitaxial layer in its upper portion.

6. The semiconductor device according to claim 3, wherein
   said bottom surface of said source/drain region is located adjacently above an upper surface of said first porous layer.

7. The semiconductor device according to claim 3, wherein
   said bottom surface of said source/drain region is located adjacently below an upper surface of said first porous layer.

8. The semiconductor device according to claim 3, wherein said first semiconductor region comprises:
   an impurity region located beneath the first porous layer, wherein the impurity region is an impurity region of said first conductivity type having a resistance lower than that of said first porous layer.

9. The semiconductor device according to claim 3 further comprising:
   a second semiconductor region of said second conductivity type formed adjacently to said first semiconductor region;
   a second porous layer formed inside said second semiconductor region as a buried layer, being connected to said first porous layer; and
   a trench-type isolation structure formed in an interface between said first semiconductor region and said second semiconductor region, extending deeper than bottom surfaces of said first and second porous layers from said upper surface of said first semiconductor region and an upper surface of said second semiconductor region.

10. A method of manufacturing a semiconductor device, comprising the steps of:
   (a) forming a first semiconductor region of a first conductivity type in which a first porous layer is formed as a buried layer; and
   (b) selectively forming a source/drain region of a second conductivity type different from said first conductivity type in an upper surface of said first semiconductor region,
      wherein a depletion layer created in a junction between said first semiconductor region and a bottom surface of said source/drain region can exist in said first porous layer.

11. The method according to claim 10, wherein said first porous layer is a porous silicon layer.

12. The method according to claim 11, wherein said porous silicon layer is formed by anodization.

13. The method according to claim 10, wherein said step (a) has the steps of
   (a-1) forming said first porous layer; and
   (a-2) forming an epitaxial layer on an upper surface of said first porous layer.

14. The method according to claim 10, wherein said step (b) has the steps of
   (b-1) introducing an impurity of said second conductivity type into said upper surface of said first semiconductor region; and
   (b-2) thermally diffusing said impurity introduced in said step (b-1),
      wherein a pn junction created in an interface between said first semiconductor region and said source/drain region at the completion of said step (b-1) is formed above said upper surface of said first porous layer.

15. The method according to claim 14, wherein said bottom surface of said source/drain region is located adjacently above said upper surface of said first porous layer at the completion of said step (b-2).

16. The method according to claim 14, wherein said bottom surface of said source/drain region is located adjacently below said upper surface of said first porous layer at the completion of said step (b-2).

17. The method according to claim 10 further comprising the step of:
   (c) forming a high-concentration impurity region of said first conductivity type at the depth deeper than said first porous layer in said first semiconductor region.

18. The method according to claim 10, wherein
   a second semiconductor region of said second conductivity type is formed adjacently to said first semiconductor region in said step (a), and
   a second porous layer connected to said first porous layer is formed inside said second semiconductor region as a buried layer (a),
   said method further comprising the step of:
   (d) forming a trench-type isolation structure in an interface between said first semiconductor region and said second semiconductor region, extending deeper than bottom surfaces of said first and second porous layers from said upper surface of said first semiconductor region and an upper surface of said second semiconductor region.

* * * * *